United States Patent
Kasorla et al.

(10) Patent No.: US 9,263,135 B2
(45) Date of Patent: Feb. 16, 2016

(54) PROGRAMMING SCHEMES FOR 3-D NON-VOLATILE MEMORY

(71) Applicant: Apple Inc., Cupertino, CA (US)

(72) Inventors: Yoav Kasorla, Kfar Netar (IL); Avraham Poza Meir, Rishon Le-Zion (IL); Eyal Gurgi, Petah-Tikva (IL)

(73) Assignee: Apple Inc., Cupertino, CA (US)

( * ) Notice: Subject to any disclaimer, the term of this patent is extended or adjusted under 35 U.S.C. 154(b) by 156 days.

(21) Appl. No.: 13/804,427

(22) Filed: Mar. 14, 2013

(65) Prior Publication Data

US 2014/0269051 A1 Sep. 18, 2014

(51) Int. Cl.
*G11C 16/04* (2006.01)
*G11C 16/10* (2006.01)
*G11C 11/56* (2006.01)
*G11C 16/34* (2006.01)

(52) U.S. Cl.
CPC ............ *G11C 16/10* (2013.01); *G11C 11/5628* (2013.01); *G11C 16/3427* (2013.01)

(58) Field of Classification Search
CPC . G11C 16/10; G11C 16/3459; G11C 16/3418
USPC ........................ 365/185.03, 185.02, 185.17
See application file for complete search history.

(56) References Cited

U.S. PATENT DOCUMENTS

| | | | |
|---|---|---|---|
| 2010/0054036 A1* | 3/2010 | Lee et al. .................. | 365/185.03 |
| 2012/0069657 A1 | 3/2012 | Choi et al. | |
| 2012/0069664 A1 | 3/2012 | Kim et al. | |
| 2013/0028027 A1 | 1/2013 | Kim et al. | |
| 2013/0275658 A1* | 10/2013 | Han et al. ...................... | 711/103 |
| 2013/0286747 A1* | 10/2013 | Kwak ....................... | 365/185.22 |
| 2013/0326312 A1* | 12/2013 | Lee et al. ....................... | 714/773 |

* cited by examiner

*Primary Examiner* — Richard Elms
*Assistant Examiner* — Xiaochun L Chen
(74) *Attorney, Agent, or Firm* — Meyertons, Hood, Kivlin, Kowert & Goetzel, P.C.

(57) ABSTRACT

A method includes providing data for storage in a memory, which includes multiple analog memory cells arranged in a three-dimensional (3-D) configuration having a first dimension associated with bit lines, a second dimension associated with word lines, and a third dimension associated with sections. The data is stored in the memory cells in accordance with a programming order that alternates among the sections, including storing a first portion of the data in a first section, then storing a second portion of the data in a second section different from the first section, and then storing a third portion of the data in the first section.

12 Claims, 3 Drawing Sheets

PROGRAMMING SCHEMES FOR 3-D NON-VOLATILE MEMORY

FIELD OF THE INVENTION

The present invention relates generally to data storage, and particularly to programming of three-dimensional memory devices.

BACKGROUND OF THE INVENTION

Various types of three-dimensional (3-D) non-volatile memory devices, and methods for programming such devices, are known in the art. For example, U.S. Patent Application Publication 2012/0069657, whose disclosure is incorporated herein by reference, describes a memory device that includes a memory cell array, in some embodiments a three-dimensional Flash memory, a self interleaver configured to interleave and load data on the fly into a buffer circuit using an interleaving scheme, and a control logic configured to control programming of the interleaved data in the memory cell array.

U.S. Patent Application Publication 2012/0069664, whose disclosure is incorporated herein by reference, describes a Flash memory system and a word line interleaving method thereof. The Flash memory system includes a memory cell array, such as a three-dimensional array, and word line interleaving logic. The memory cell array is connected to a plurality of word lines. The word line (WL) interleaving logic performs an interleaving operation on WL data corresponding to at least two different word lines and programs data, including the interleaved data, to the memory cell array.

U.S. Patent Application Publication 2013/0028027, whose disclosure is incorporated herein by reference, describes a 3-D semiconductor memory device including a plurality of memory cell strings, includes a substrate and a channel that extends from the substrate. Memory cells may be disposed in layers in which the diameter of the channel varies. A programming verification operation may be carried out in a sequence whereby memory cells more likely to fail in programming are verified before attempting to verify memory cells that are less likely to fail programming. In an exemplary embodiment, the verification operation is performed on a memory cell disposed in a layer associated with a larger-diameter channel before performing the verification on a memory cell disposed in a layer associated with a smaller-diameter channel.

SUMMARY OF THE INVENTION

An embodiment of the present invention that is described herein provides a method including providing data for storage in a memory. The memory includes multiple analog memory cells arranged in a three-dimensional (3-D) configuration having a first dimension associated with bit lines, a second dimension associated with word lines, and a third dimension associated with sections. The data is stored in the memory cells in accordance with a programming order that alternates among the sections, including storing a first portion of the data in a first section, then storing a second portion of the data in a second section different from the first section, and then storing a third portion of the data in the first section.

In some embodiments, each of the memory cells is capable of storing at least a respective Least Significant Bit (LSB) and a respective Most Significant Bit (MSB), and storing the data includes, in a given word line, storing the first and second portions in LSBs of the memory cells of the first and second sections, and then storing the third portion in MSBs of the memory cells of the first section.

In other embodiments, storing the data includes applying to the memory cells respective sequences of programming and verification iterations. Applying the sequences may include time-interleaving the sequences applied in the first and second sections of a given word line with one another.

There is additionally provided, in accordance with an embodiment of the present invention, apparatus including an interface and storage circuitry. The interface is configured to communicate with a memory, which includes multiple analog memory cells arranged in a three-dimensional (3-D) configuration having a first dimension associated with bit lines, a second dimension associated with word lines, and a third dimension associated with sections. The storage circuitry is configured to store data in the memory cells in accordance with a programming order that alternates among the sections, including storing a first portion of the data in a first section, then storing a second portion of the data in a second section different from the first section, and then storing a third portion of the data in the first section.

There is also provided, in accordance with an embodiment of the present invention, apparatus including a memory and storage circuitry. The memory includes multiple analog memory cells, which are arranged in a three-dimensional (3-D) configuration having a first dimension associated with bit lines, a second dimension associated with word lines, and a third dimension associated with sections. The storage circuitry is configured to store data in the memory cells in accordance with a programming order that alternates among the sections, including storing a first portion of the data in a first section, then storing a second portion of the data in a second section different from the first section, and then storing a third portion of the data in the first section.

The present invention will be more fully understood from the following detailed description of the embodiments thereof, taken together with the drawings in which:

DETAILED DESCRIPTION OF EMBODIMENTS

Overview

Embodiments of the present invention that are described herein provide improved methods and systems for data storage in three-dimensional (3-D) non-volatile memory. In the disclosed embodiments, a memory controller stores data in a memory that comprises multiple analog memory cells, such as Flash cells, which are arranged in a 3-D configuration. The three dimensions of the memory are associated with Word Lines (WLs), Bit Lines (BLs) and sections, i.e., each memory cell is connected to a certain WL and a certain BL, and lies in a certain section.

In a configuration of this sort, memory cells that belong to different sections but share the same WL and BL may disturb one another, and this effect may cause severe performance degradation. The disclosed techniques reduce inter-section disturb by using unique programming orders.

In some embodiments that are described herein, the memory cells are programmed using an iterative programming and verification (P&V) process. Because of alternation between the sections, the final iteration of the P&V process in a given memory cell is performed while the corresponding memory cells in the other sections are at least partly programmed already. Therefore, the disclosed programming orders reduce the interference between sections considerably.

Several examples of programming orders are described herein. In some embodiments, the P&V process is applied in parallel to the memory cells in the various sections of a given WL. In other words, the sequences of P&V iterations applied in the different sections are time-interleaved with one another, e.g., on a pulse-by-pulse basis. In some embodiments, the memory controller first programs the lower-order pages in all sections of a given WL, and then proceeds to program the higher-order pages.

The methods and systems described herein reduce disturb effects in 3-D memory considerably. When using these techniques, storage reliability is increased. Moreover, the memory can be designed with a larger number of sections and therefore with larger capacity.

System Description

Figure 1:
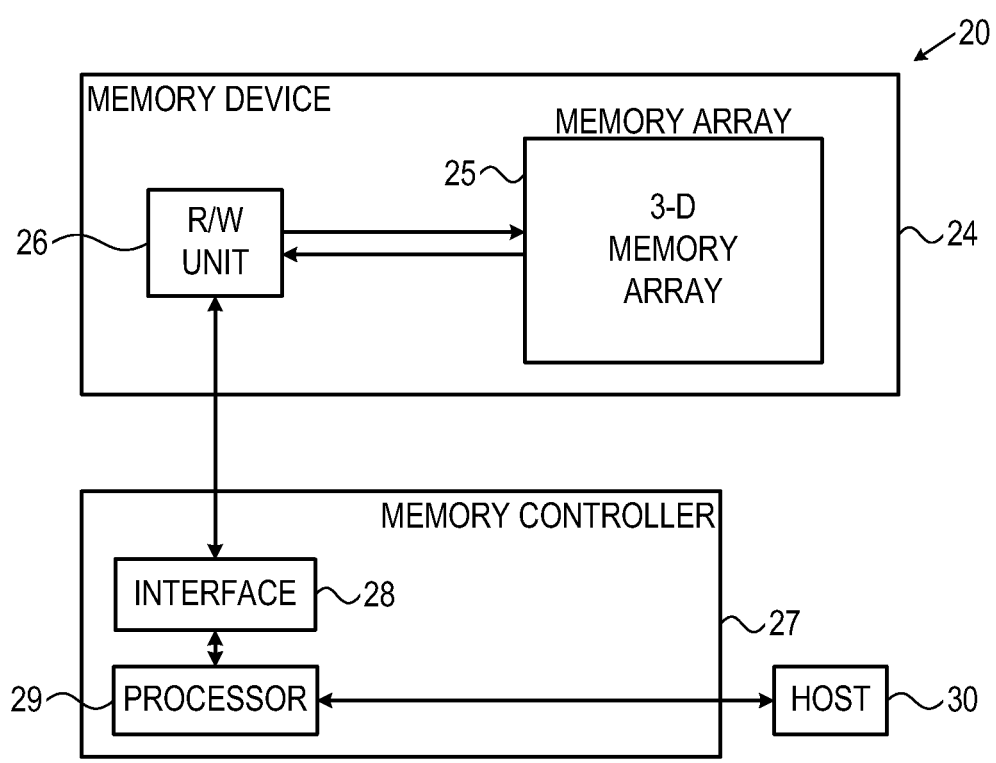
FIG. 1 is a block diagram that schematically illustrates a memory system, in accordance with an embodiment of the present invention.

FIG. 1 is a block diagram that schematically illustrates a memory system 20, in accordance with an embodiment of the present invention. System 20 can be used in various host systems and devices, such as in computing devices, cellular phones or other communication terminals, removable memory modules (sometimes referred to as "USB Flash Drives"), Solid State Disks (SSD), digital cameras, music and other media players and/or any other system or device in which data is stored and retrieved.

System 20 comprises a memory device 24, which stores data in a three-dimensional (3-D) memory cell array 25. The memory array comprises multiple 3-D memory blocks. Each memory block comprises multiple analog memory cells. The structure of memory 25 is explained in detail below. In the context of the present patent application and in the claims, the term "analog memory cell" is used to describe any memory cell that holds a continuous, analog value of a physical parameter, such as an electrical voltage or charge. Array 25 may comprise analog memory cells of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM), magnetic RAM (MRAM) and/or Dynamic RAM (DRAM) cells.

The charge levels stored in the cells and/or the analog voltages or currents written into and read out of the cells are referred to herein collectively as analog values, analog storage values or storage values. The storage values may comprise, for example, threshold voltages or any other suitable kind of storage values. System 20 stores data in the analog memory cells by programming the cells to assume respective programming states, which are also referred to as programming levels. The programming states are selected from a finite set of possible states, and each programming state corresponds to a certain nominal storage value. For example, a 3 bit/cell MLC can be programmed to assume one of eight possible programming states by writing one of eight possible nominal storage values into the cell.

Memory device 24 comprises a reading/writing (R/W) unit 26, which converts data for storage in the memory device to analog storage values and writes them into the memory cells. In alternative embodiments, the R/W unit does not perform the conversion, but is provided with voltage samples, i.e., with the storage values for storage in the cells. When reading data out of array 25, R/W unit 26 converts the storage values of the memory cells into digital samples having a resolution of one or more bits. Data is typically written to and read from the memory cells in groups that are referred to as pages. In some embodiments, the R/W unit can erase a group of cells by applying one or more negative erasure pulses to the cells. Erasure is typically performed in entire memory blocks.

The storage and retrieval of data in and out of memory device 24 is performed by a memory controller 27. The memory controller comprises an interface 28 for communicating with memory device 24, and a processor 29 that carries out the various memory management functions. Memory controller 27 communicates with a host 30, for accepting data for storage in the memory device and for outputting data retrieved from the memory device. Memory controller 27, and in particular processor 29, may be implemented in hardware. Alternatively, the memory controller may comprise a microprocessor that runs suitable software, or a combination of hardware and software elements.

The configuration of FIG. 1 is an exemplary system configuration, which is shown purely for the sake of conceptual clarity. Any other suitable memory system configuration can also be used. Elements that are not necessary for understanding the principles of the present invention, such as various interfaces, addressing circuits, timing and sequencing circuits and debugging circuits, have been omitted from the figure for clarity.

Although the example of FIG. 1 shows a single memory device 24, system 20 may comprise multiple memory devices that are controlled by memory controller 27. In the exemplary system configuration shown in FIG. 1, memory device 24 and memory controller 27 are implemented as two separate Integrated Circuits (ICs). In alternative embodiments, however, the memory device and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory array is disposed. Further alternatively, some or all of the functionality of memory controller 27 can be implemented in software and carried out by a processor or other element of the host system. In some embodiments, host 30 and memory controller 27 may be fabricated on the same die, or on separate dies in the same device package.

In some embodiments, memory controller 27 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

The description that follows describes techniques for storing data in memory array 25. The disclosed techniques can be carried out by memory controller 27 and/or by R/W unit 26. For the sake of clarity, the description that follows refers to a particular division of functions between R/W unit 26 in the memory device and processor 29 in memory controller 27. Generally, however, the various tasks making-up the disclosed techniques can be divided between the memory controller and the R/W unit in any suitable manner, or performed by any one of these elements. Thus, in the context of the present patent application and in the claims, memory controller 27 and R/W unit 26 are referred to jointly as storage circuitry that carries out the disclosed techniques.

3-D Memory Structure

Figure 2:
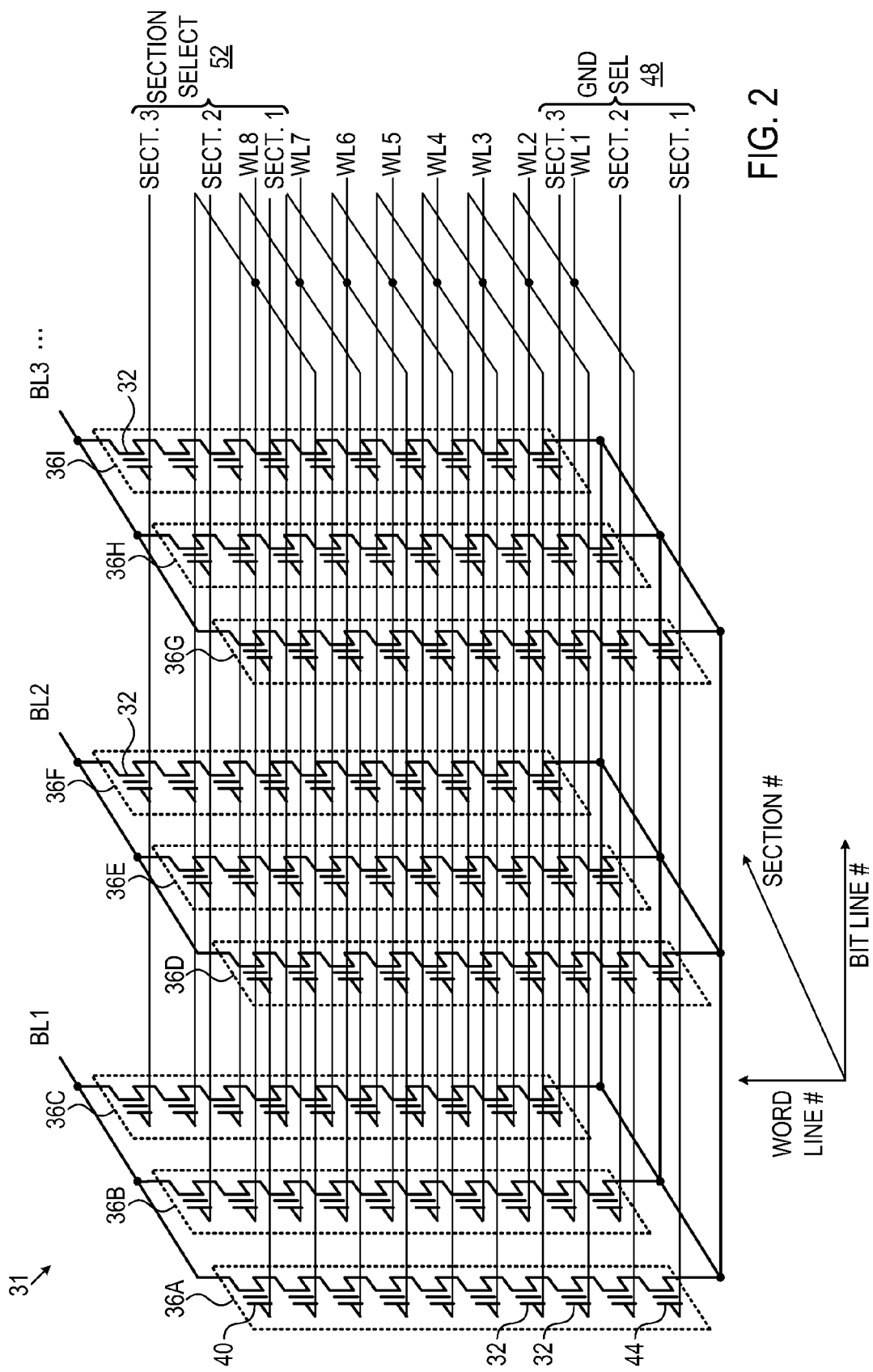
FIG. 2 is a block diagram that schematically illustrates a three-dimensional (3-D) memory block, in accordance with an embodiment of the present invention.

FIG. 2 is a block diagram that schematically illustrates the internal structure of a 3-D memory block 31 in array 25, in accordance with an embodiment of the present invention. The figure shows a single 3-D memory block for the sake of clarity. The other memory blocks in array 25 typically have a similar structure. Note that the configuration of FIG. 2 shows the topology and electrical connectivity of block 31, but not necessarily the physical arrangement of the memory cells. An example physical implementation is described further below.

Memory block 31 comprises multiple memory cells 32 that are arranged in a three-dimensional structure. The three dimensions of the memory block are associated with bit lines (denoted BL1, BL2, BL3, . . . ), word lines (denoted WL1 . . . WL8) and sections (denoted SECTION1, SECTION2, SECTION3), respectively. The sections are selected using section select lines 52 (one line for each respective section) and ground select lines 48 (one line for each respective section). The WLs, BLs, section select lines and ground select lines are accessed by R/W unit 26, as will be explained below.

Each memory cell 32 belongs to a certain cell string 36. The figure shows nine strings denoted 36A . . . 36I. Strings 36A, 36D, 36G, . . . belong to SECTION1, strings 36B, 36E, 36H, . . . belong to SECTION2, and strings 36C, 36F, 36I, . . . belong to SECTION3. The figure shows only the first three strings of each section for the sake of clarity. The 3-D memory block typically comprises thousands of bit lines, and thus thousands of strings in each section.

In each string, each memory cell is connected to a respective WL. The number of memory cells per string is thus equal to the number of WLs. As can be seen in the figure, the first WL is connected to the first memory cell in all the strings of all the sections of the block, the second WL is connected to the second memory cell in all strings, and so on.

A page of data is typically written by R/W unit 26 to a group of memory cells 32 that belongs to a certain WL and lies in a certain section. In a Multi-Level Cell (MLC) device, two or more pages can be written to the same group of cells. For example, a page of data can be written to the first memory cells in strings 36A, 36D, 36G, . . . , i.e., the group of memory cells belonging to WL1 and to SECTION1. Another page can be written to the second memory cells in strings 36A, 36D, 36G, . . . , i.e., the group of memory cells belonging to WL2 and to SECTION1. Similarly, a page can be written to the $i^{th}$ memory cells (i=1 . . . 8) of the strings of any section. Data readout is also performed by page in a similar manner.

In order to access a certain set of strings 36, e.g., for writing or reading data, R/W unit 26 enables the appropriate strings using section select lines 52 and ground select lines 48. Each string 36 comprises a string select switch 40 that is controlled by the appropriate section select line 52, and a ground select switch 44 that is controlled by the appropriate ground select switch 48. For example, in order to access a page of data that is stored in SECTION2, R/W unit 26 selects the section select line 52 and the ground select line 48 of SECTION2, and then accesses the WL to which the group of cells belongs.

The configuration of block 31 shown in FIG. 2 is an example configuration that is chosen purely for the sake of conceptual clarity. In alternative embodiments, any other suitable configuration can be used. Moreover, the configuration of FIG. 2 shows the topology and electrical connectivity of block 31, but not necessarily the physical arrangement of the memory cells and strings. In an example physical implementation, each string 36 is a U-shaped and the U-shaped strings are fabricated on a common substrate. In this "folded" implementation both section select lines 52 and ground select lines 48 are accessible from the top of the device. Block 31 may be fabricated, for example, using a Silicon-Oxide-Nitride-Oxide-Silicon (SONOS) process, or using any other suitable semiconductor process.

3-D Programming Orders for Reducing Interference

The 3-D memory configuration of FIG. 2 gives rise to various distortion mechanisms that distort the analog values stored in memory cells 32. One example is disturb originating from other strings that share the same BL and WL as the interfered memory cell. As can be seen in FIG. 2, biasing the $i^{th}$ WL biases the $i^{th}$ memory cells in all the strings of all the sections in the 3-D block. Similarly, biasing a certain BL biases all the strings that are connected to this BL.

Therefore, strings that share the same BL and WL may cause disturb to one another. This sort of disturb may be very strong, and in some practical cases it may be the limiting factor in determining the number of sections per block.

In some embodiments, system 20 programs memory cells 32 in a programming order that reduces the above-described disturb. The programming orders described herein alternate between the sections in the block instead of programming an entire section before proceeding to the next.

The programming of each memory cell comprises an iterative programming and verification (P&V) process. Because of the alternation between the sections, the final iteration of the P&V process in a given memory cell is performed while the corresponding memory cells in the other sections are at least partly programmed already. Therefore, the disclosed programming orders reduce disturbance effects considerably.

Consider, for example, a 2-bits/cell MLC device in which each memory cell 32 stores a Least Significant Bit (LSB) and a Most Significant Bit (MSB). In such a device, each group of cells that belongs to a certain WL and a lies in a certain section stores an LSB page and an MSB page.

In some embodiments, memory controller 27 and R/W unit 26 store data in the memory cells of WL1 (in all sections), then proceed to store data in the memory cells of WL2 (in all sections) and so on, until finally storing data in the memory cells of the last WL-WL8. In an example embodiment, the R/W unit performs the iterative P&V process in parallel over the memory cells of each WL (in all sections), one WL after the other. In other words, the P&V iterations applied in the various sections of a given WL are interleaved in time with one another. The programming order in this embodiment is as follows:

TABLE 1

| Example programming order |
|---|
| LSB pages of WL1, all sections |
| MSB pages of WL1, all sections |
| LSB pages of WL2, all sections |
| MSB pages of WL2, all sections |
| LSB pages of WL3, all sections |
| MSB pages of WL3, all sections |
| . . . |
| LSB pages of WL8, all sections |
| MSB pages of WL8, all sections |

Each step of the above scheme programs three pages, and is implemented using the following loop:

TABLE 2

Example pulse-by-pulse sequence

Programming & verification iteration in the WL, SECTION1
Programming & verification iteration in the WL, SECTION2
Programming & verification iteration in the WL, SECTION3
...
Repeat until all three pages are programmed In the above example, as well as in the examples below, parameter values such as block dimensions (e.g., number of word lines and sections) are shown purely by way of example. Any other suitable values can be used in alternative embodiments.

In an alternative embodiment, memory controller 27 stores data in ascending order of WLs, and in alternating order of the sections. The programming order in this example is as follows:

TABLE 3

Example programming order

LSB page of WL1, SECTION1
LSB page of WL1, SECTION2
LSB page of WL1, SECTION3
MSB page of WL1, SECTION1
MSB page of WL1, SECTION2
MSB page of WL1, SECTION3
LSB page of WL2, SECTION1
LSB page of WL2, SECTION2
LSB page of WL2, SECTION3
MSB page of WL2, SECTION1
MSB page of WL2, SECTION2
MSB page of WL2, SECTION3
...
LSB page of WL8, SECTION1
LSB page of WL8, SECTION2
LSB page of WL8, SECTION3
MSB page of WL8, SECTION1
MSB page of WL8, SECTION2
MSB page of WL8, SECTION3

As can be seen in the tables above, the disclosed programming orders program the LSB pages in a given WL before proceeding to program the MSB pages of this WL. This order is highly effective in reducing interference between strings.

In alternative embodiments, system 20 may use various hybrid schemes that combine the two programming orders above. Further alternatively, system 20 may apply any other suitable programming order that alternates between the sections of the memory block (i.e., stores data in one section, then proceeds to store data in another section, and later returns to store data in the first section.) Although the examples above refer to 2-bits/cell MLC, the disclosed techniques can be used with any other suitable number of bits per cell, including Single Level Cells (SLC) that store one bit per cell.

Figure 3:
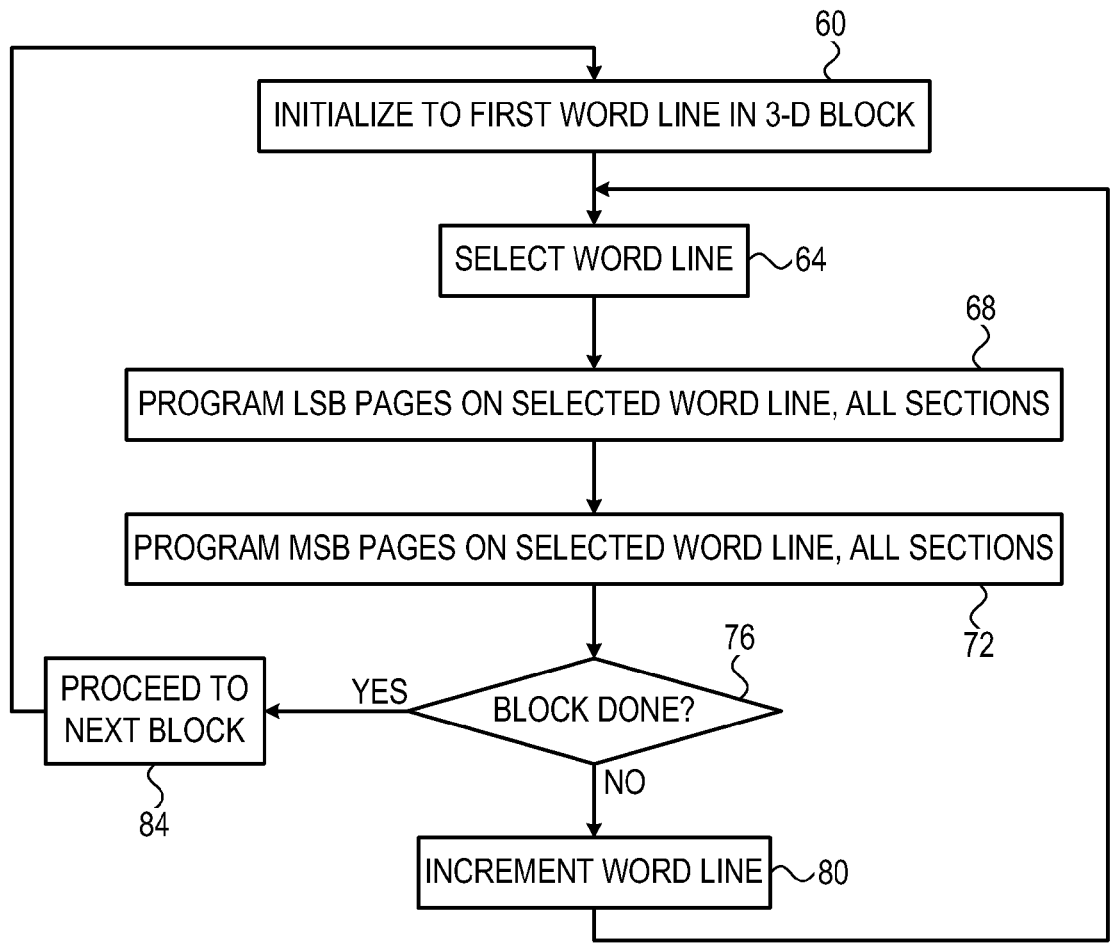
FIG. 3 is a flow chart that schematically illustrates a method for programming a 3-D memory, in accordance with an embodiment of the present invention.

FIG. 3 is a flow chart that schematically illustrates a method for programming 3-D memory array 25, in accordance with an embodiment of the present invention. The method begins with memory controller 27 selecting an erased 3-D block 31 for programming, and initializing to program the first WL in this block, at an initialization step 60.

Memory controller 27 selects the current WL to program, at a WL selection step 64. The memory controller programs the LSB pages of all sections of the selected WL, at an LSB programming step 68, and then programs the MSB pages of all sections of the selected WL, at an MSB programming step 72. Steps 68 and 72 may be implemented using the alternating pulse-by-pulse example of Tables 1 and 2, or using the page-by-page example of Table 3.

Memory controller 27 checks whether the block is fully programmed, at a completion checking step 76. If not, the memory controller increments the index of the WL to be programmed, at a WL incrementing step 80. The method then loops back to step 64 in which the memory controller begins to program the next WL.

If the block is fully programmed, memory controller selects the next block to be programmed, at a next block selection step 84. The method then loops back to step 60 and the memory controller begins to store data in the new block.

It will be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A method, comprising:

providing data for storage in a memory, which comprises multiple memory cells arranged in a three-dimensional (3-D) configuration having a first dimension associated with bit lines, a second dimension associated with word lines, and a third dimension associated with sections; and performing, in parallel, a first programming and verification operation for a given word line in a first section using a first portion of data, a second programming and verification operation for the given word line in a second section using a second portion of the data, and a third programming and verification operation the given word line in a third section using a third portion of the data.

2. The method according to claim 1, wherein each of the memory cells is capable of storing at least a respective Least Significant Bit (LSB) and a respective Most Significant Bit (MSB), wherein performing the first programming and verification operation for the given word line includes storing the first portion of the data in the LSBs of a first set of memory cells coupled to the given word line in the first section, wherein performing the second programming and verification operation for the given word line in the second section includes storing the second portion of the data in LSBs of a second set of memory cells of coupled to the given word line in the second section, and performing the third programming and verification operation for the given word line in the third section includes storing the third portion of the data in LSBs of a third set of memory cells coupled to the given word line in the second section.

3. The method according to claim 2, wherein performing the first programming and verification operation, the second programming and verification operation, and the third programming and verification operation comprises applying to the first set of memory cells, the second set of memory cells, and the third set of memory cells respective sequences of programming and verification iterations.

4. The method according to claim 3, wherein applying the sequences comprises time-interleaving the sequences applied in the first, second and third sections of the given word line with one another word line.

5. An apparatus, comprising:
an interface configured to communicate with a memory, which comprises multiple memory cells arranged in a three-dimensional (3-D) configuration having a first dimension associated with bit lines, a second dimension associated with word lines, and a third dimension associated with sections; and
storage circuitry configured to perform, in parallel, a first programming and verification operation for a given word line in a first section using a first portion of the data, a second programming and verification operation for the given word line in a second section using a second portion of the data, and a third programming and verification operation for the given word line in a third section using a third portion of the data.

6. The apparatus according to claim 5, wherein each of the memory cells is capable of storing at least a respective Least Significant Bit (LSB) and a respective Most Significant Bit (MSB), wherein perform the first programming and verification operation, the storage circuitry is further configured to store the first portion of the data in LSBs of a first set of memory cells coupled to the given word line in the first section, wherein to perform the second programming and verification operation, the storage circuitry is further configured to store second portion of the data in LSBs of a second set of memory cells coupled to the given word line in the second section, and wherein to perform the third programming and verification operation, the storage circuitry is further configured to store the third portion of data in a third set of memory cells coupled to the given word line in the third section.

7. The apparatus according to claim 6, wherein to perform the first programming and verification operation, the second programming and verification operation, and the third programming and verification operation the storage circuitry is further configured to apply to the first, second, and third sets of memory cells respective sequences of programming and verification iterations.

8. The apparatus according to claim 7, wherein the storage circuitry is further configured to time-interleave the sequences applied in the first, second, and third sections of the given word line with one another word line.

9. An apparatus, comprising:
a memory comprising multiple memory cells, which are arranged in a three-dimensional (3-D) configuration having a first dimension associated with bit lines, a second dimension associated with word lines, and a third dimension associated with sections; and
storage circuitry is configured to perform, in parallel, a first programming and verification operation for a given word line in first section using a first portion of data, a second programming and verification operation for the given word line in the second section using a second portion of the data, and a third programming and verification operation for the given word line in the third section using a third portion of the data.

10. The apparatus according to claim 9, wherein each of the memory cells is capable of storing at least a respective Least Significant Bit (LSB) and a respective Most Significant Bit (MSB), wherein to perform the first programming and verification operation, the storage circuitry is further configured to store the first portion of the data in LSBs of a first set of memory cells coupled to the given word line in the first section, wherein to perform the second programming and verification operation, the storage circuitry is further configured to store the second portion of data in a second set of memory cells coupled to the given word line in the second section, and wherein to perform the third programming and verification operation, the storage circuitry is further configured to store the third portion of the data in a third set of memory cells coupled to the given word line in the third section.

11. The apparatus according to claim 10, wherein to perform the first programming and verification operation, the second programming and verification operation, and the third programming and verification operation storage circuitry is further configured to apply to the first set memory cells, the second set of memory cells, and the third set of memory cells respective sequences of programming and verification iterations.

12. The apparatus according to claim 11, wherein the storage circuitry is further configured to time-interleave the sequences applied in the first, second, and third sections of the given word line with one another word line.

* * * * *